United States Patent
Scholtens (10) Patent No.: US 6,624,778 B2
(45) Date of Patent: Sep. 23, 2003

(54) AVERAGING AMPLIFIER ARRAY

(75) Inventor: Peter Cornelis Simeon Scholtens, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/183,761

(22) Filed: Jun. 27, 2002

(65) Prior Publication Data

US 2003/0141999 A1 Jul. 31, 2003

(51) Int. Cl.[7] .............................. H03M 1/12; H03M 1/78
(52) U.S. Cl. ......................................... 341/155; 341/154
(58) Field of Search ................................ 341/155, 157, 341/118, 154; 324/248, 72, 96

(56) References Cited

U.S. PATENT DOCUMENTS

| | | | |
|---|---|---|---|
| 5,157,397 A | * 10/1992 | Vernon | 341/157 |
| 5,994,891 A | * 11/1999 | Hubbell | 324/96 |
| 6,005,380 A | * 12/1999 | Hubbell | 324/72 |
| 6,362,617 B1 | * 3/2002 | Hubbell | 324/248 |

OTHER PUBLICATIONS

2002 IEEE International, "2002 Digest of Technical Papers" vol. Forty–Five ISSN 0193–6530.

* cited by examiner

*Primary Examiner*—Patrick Wamsley
(74) *Attorney, Agent, or Firm*—Steven R. Biren (57) ABSTRACT

A plurality of amplifying circuits having generally uniform amplifying and impedance characteristics, a reference voltage network applying reference voltages of a generally uniformly spacing to each reference voltage terminal of said amplifying circuits, wherein a relative functional position of each amplifying circuit is determined by the magnitude of a received reference voltage; an averaging network, comprising of generally identical averaging impedances coupling output voltage terminals of adjacent amplifying circuits; wherein the amplifying and/or impedance characteristics of said termination circuit and/or the termination reference voltage, and/or the termination averaging impedance are deviant to generate a current in said output voltage terminal of said outer amplifying circuit of said array, that is corrected for the finite size of the array.

10 Claims, 6 Drawing Sheets

AVERAGING AMPLIFIER ARRAY

The invention relates to an AD-converter, comprising: a plurality of amplifying circuits having generally uniform amplifying and impedance characteristics, each circuit comprising: an input voltage terminal; a reference voltage terminal; and an output voltage terminal; the AD-converter further comprising an input voltage network applying an analog input voltage to each input voltage terminal of said amplifying circuits; a reference voltage network applying reference voltages of a generally uniformly spacing to each reference voltage terminal of said amplifying circuits, wherein a relative functional position of each amplifying circuit is determined by the magnitude of a received reference voltage; an averaging network, comprising of generally identical averaging impedances coupling output voltage terminals of adjacent amplifying circuits; an output voltage network for outputting amplified voltage differences from each of said plurality of amplifying circuits; and a termination network comprising a termination circuit and a termination averaging impedance, said termination circuit receiving an input voltage and a termination reference voltage and comprising an output voltage terminal that is coupled by said termination averaging impedance to an output voltage terminal of an outer amplifying circuit of said array.

Such an AD-converter is known from "A 6b 500 MSample/s ADC for a Hard Disk Drive Read Channel", Tamba, Y, ISSCC'99, pp. 324–325, and comprises an averaging network to reduce the offsets of the amplifiers. However, applying averaging will create a load which depends on the position of the amplifier in the array. Through the averaging network, a shift in the zero crossing is introduced, compared to an ideal network wherein the amplifying circuits do not suffer from offset errors. Due to the finiteness of the array of amplifying circuits, the zero crossing is non-linear towards the outer circuits of the AD-converter array. In order to resemble an infinite array, the disclosed termination network comprises a series of "dummy" amplifiers. By using only a series of innermost amplifiers boundary effects are suppressed.

In this known solution, it is clear, that a termination will be more effective if more and more dummy amplifiers are used on either sides of the array, because an increase in the number of amplifiers will resemble an infinite array better. As an example, a number of 6 overrange amplifiers is used in case of an AD-convertor array comprising 16 AD-amplifiers, and for instance, 18 overrange amplifiers are used in case of 63 amplifier array.

The above mentioned disclosed embodiment suffers from the drawback, that linearity is not restored completely, but only approached to a limit, wherein for a better linearity, more and more dummy amplifiers are inserted. Besides an unsatisfying linearity, also the power dissipation and input capacitance of this embodiment are quite unprofitable.

The invention aims to obviate the above mentioned problem and has as one of its goals to provide an improved AD-converter, having improved linearity properties and less power dissipation.

In accordance with the invention, the AD-converter of the above mentioned type is characterized in that the amplifying and/or impedance characteristics of said termination circuit and/or the termination reference voltage, and/or the termination averaging impedance are deviant to generate a current in said output voltage terminal of said outer amplifying circuit of said array, that is corrected for the finite size of the array.

In other words, a termination circuit deviates in at least one of its constituting components from the amplifying circuits of the array. That is, the amplifying and/or impedance characteristics of said termination circuit deviate from the generally uniform amplifying and/or impedance characteristics of the amplifying circuits of the array; and/or a voltage difference between said termination reference voltage and a reference voltage received by an outer amplifying circuit deviates from a voltage difference between reference voltages of two adjacent amplifying circuits in the array; and/or a termination averaging impedance deviates from averaging impedances used in said array.

Throughout the remainder of the text, the term "deviant" or "deviates" is used in contrast to the term "generally uniform" in the above referenced context. The AD-converter according to the invention is especially beneficial since it offers a termination circuit with a minimum number of components, similar in design as the amplifying circuits of said array, thus eliminating the need for complicated, slow and/or power-absorbing extra circuits, while at the same time boundary effects may be eliminated rigorously, in contrast to the termination networks of the prior art, which merely seek to achieve a less-rigorous compensation for said boundary effects.

In a preferred embodiment, the amplifying and/or impedance characteristics of said termination circuit and/or the termination reference voltage, and/or the termination averaging impedance of said termination network deviate so that currents through each averaging impedance between adjacent output voltage terminals of said array are generally equal in magnitude. In this way, according to the invention, a termination of the AD-converter may be provided, wherein linearity of the array is optimally restored. The zero crossing of the termination amplifier circuit is shifted strongly, and therefore not usable, in favor of the recovered position of the zero crossing of amplifiers in the array. Such a redefinition of the edge termination circuit not only recovers the linearity at the edge, but also prevents propagation of an imbalance between amplifiers.

In one embodiment, the invention is characterized in that a voltage difference between said termination reference voltage and a reference voltage received by an outer amplifying circuit is larger as compared to the generally uniform spacing between each reference voltage received by said amplifier circuits, wherein the amplifying and impedance characteristics of said termination circuit and the termination averaging impedance are not deviant.

Specifically, in a preferred embodiment according to the invention, in an array comprising amplifier circuits having an output impedance of R1 and coupled by averaging impedances having a value of R2, the voltage difference is preferably a factor $$\frac{R1 + R2}{R2}$$

larger compared to said uniform spacing. In this preferred embodiment an output terminal may also be coupled to the termination circuit, since the voltage difference over the averaging resistor is generally equal to the differences of the averaging resistors of the rest of the amplifying circuits. This modification has as a special advantage that no dummy circuit whatsoever needs to be active in order to restore linearity properties.

In another preferred embodiment, the termination circuit has a zero output impedance wherein the amplifying characteristics of said termination circuit, the termination reference voltage and the termination averaging impedance are not deviant.

In yet another preferred embodiment, in an array comprising amplifier circuits having an output impedance of R1 and coupled by averaging impedances having a value of R2, the termination averaging impedance equals R2−R1, wherein the amplifying and impedance characteristics of said termination circuit and the termination reference voltage are not deviant. Again, since the averaging impedance is left unaltered, an output terminal may also be coupled to the termination circuit.

In still another embodiment wherein R1>R2, in an array comprising amplifier circuits having an output impedance of R1 and coupled by averaging impedances having a value of R2, the termination averaging impedance may be created by an active circuit, wherein the amplifying and impedance characteristics of said termination circuit and the termination reference voltage are not deviant. By such an active circuit, an effective negative impedance may be created in order to achieve the termination according to the invention.

Specifically, in the case wherein R1>R2, the termination network may comprise a plurality of termination circuits, wherein at least two output voltage terminals of two adjacent termination circuits are short-circuited. Therefore, according to an aspect of the invention, by short-circuiting the outer output voltage terminals, linearity of the inner output voltage terminals is restored.

More specifically, the termination network comprises two termination circuits comprising output voltage terminals which are short circuited, the amplifying circuits further receiving an equally spaced referenced voltage and being connected to the input voltage, wherein the output voltage terminals of said amplifying circuits are coupled by a termination averaging impedance to an output voltage terminal of an outer amplifying circuit of said array, the termination averaging impedance equaling $$\frac{3}{2}R2 - \frac{1}{2}R1,$$

wherein the amplifying and impedance characteristics of said termination circuit and the termination reference voltages are not deviant.

The invention further relates to a method of designing an AD-converter, wherein the amplifying and impedance characteristics of said termination circuit and the termination reference voltage are generally uniform in magnitude, in an array comprising amplifier circuits having an output impedance of R1 and coupled by averaging impedances having a value of R2, wherein R1>R2, the method comprising the steps of: short-circuiting two output voltage terminals of two adjacent termination circuits; and the method further comprising repeating the steps of: calculating a magnitude of a first termination impedance which couples an output voltage terminal of said termination circuit to a first output voltage terminal of an amplifying circuit adjacent to said termination circuit, so that currents through each averaging impedance between adjacent output voltage terminals of said array are generally equal in magnitude; and if said magnitude is negative, short circuiting said output voltage terminal of said termination circuit to said first output voltage terminal and calculating a magnitude of a next termination impedance which couples an output voltage terminal of said termination circuit to a next output voltage terminal of an amplifying circuit adjacent to said termination circuit.

According to the method of the invention it becomes apparent, that, even if a first step calculation indicates a design where unphysical properties of the termination averaging impedance are required, such a requirement can be met by "offering" an outer amplifying circuit of the array, which thereby becomes a part of the termination network; and recalculate the desired termination impedances of the next adjacent termination circuit. In this way, the required termination averaging impedance will become more positive, and after repeating the above mentioned steps, a positive dimensioned termination averaging impedance can be calculated for correcting the array according to the invention.

Further objects and features of the invention will become apparent from the drawings, wherein.

Figure 1:
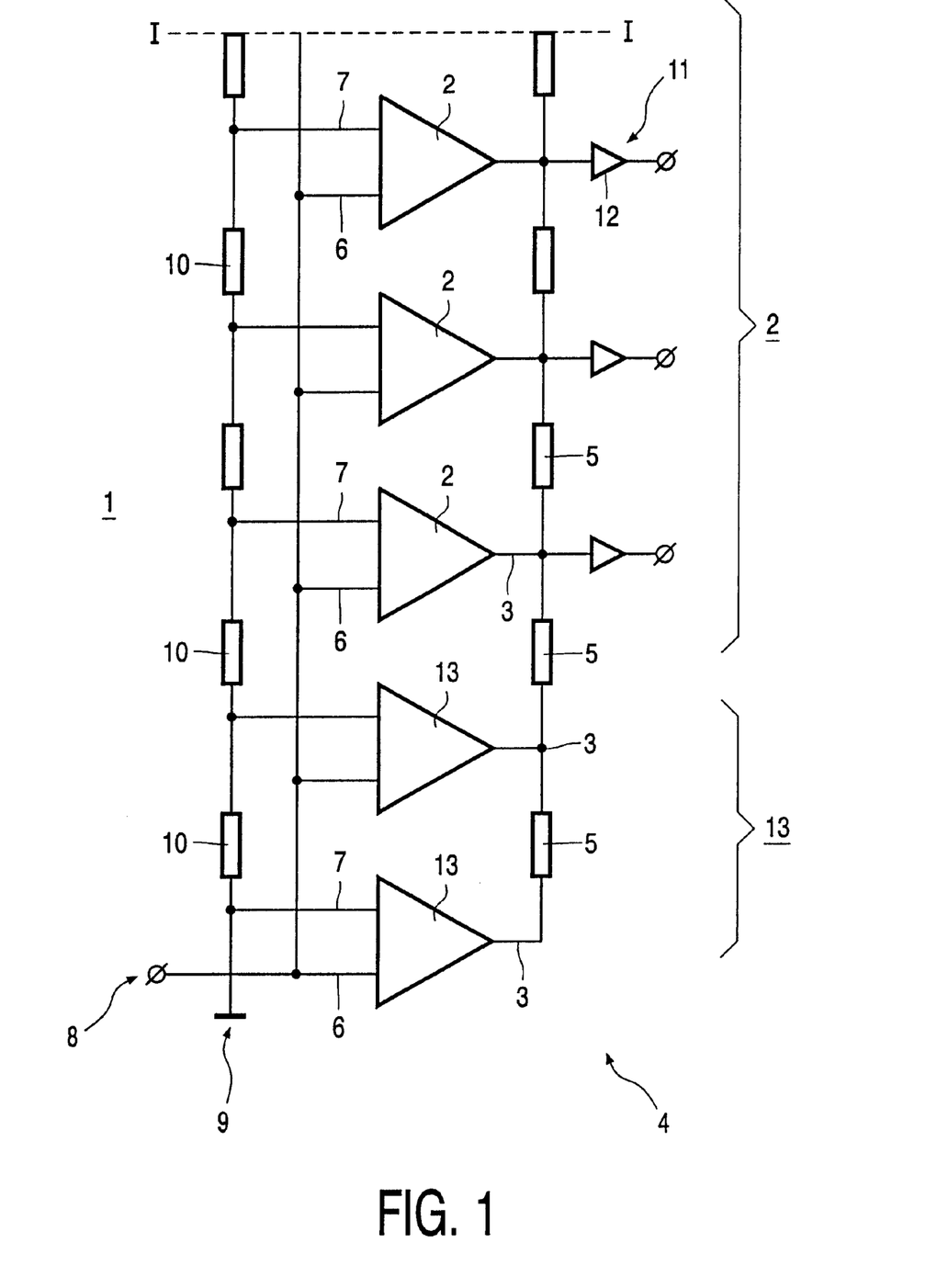
FIG. 1 shows a schematic illustration of an AD-converter according to the prior art.

In FIG. 1 a schematic illustration is presented of an AD-converter 1 according to the prior art. In the drawing, only a lower half of the array 1 is illustrated, terminated by the line I—I. The AD-converter 1 is for instance used in magnetic or optical storage systems. Due to the threshold voltage mismatch, the amplifiers 2 will suffer from an offset if no precautions are taken. However, to profit of the maximum bandwidth of the technology used the amplifiers 2 do not have a conventional offset correction. The illustrated topology is a flash ADC: an array 1 of amplifiers 2 each receiving a slightly different reference input voltage level. To reduce the influence of the offset of the array of parallel amplifiers 2, output voltage terminals 3 of each amplifying circuit 2 are coupled to output voltage terminals 3 of adjacent amplifying circuits 2 through an averaging network 4 comprising resistors 5. The amplifying circuits 2 further comprise at least an input voltage terminal 6 and a reference voltage terminal 7 for amplifying a voltage difference received between said terminals 6, 7. An input voltage network 8 is present for applying an analog input voltage to each input voltage terminal 6 of each amplifying circuit 2; a reference voltage network 9 comprises a series of reference impedances 10 of a general uniform magnitude, for generating reference voltages of a generally uniformly spacing for each reference voltage terminal 7 of said amplifying circuits 2. The array 1 further comprises an output voltage network 11 for outputting an output voltage received on output voltage terminals 3 by means of for example amplifiers or source-followers 12.

The AD-converter according to the prior art is designed as an array of generally uniform amplifying circuits 2 with substantially identical amplifying and impedance characteristics. In such an array 1, due to the averaging network 4 of resistors 5, a shift in the zero crossing is introduced, compared to an ideal network wherein the amplifying circuits do not suffer from offset errors. Due to the finiteness of the array 1 of amplifying circuits 2, the zero crossing is non-linear towards the outer circuits of the AD-converter array 1. In order to resemble an infinite array, the termination network of the prior art comprises a series of "dummy" amplifiers 13 which are not coupled to the output voltage network 11. In this way only the innermost amplifying circuits 2, which have relatively optimal linearity properties, are used.

The prior art termination network is thus formed by outer amplifier circuits 13 of the array 1. These outer circuits 13 have a general identical structure as the amplifier circuits of the array, but are not coupled to the output network.

Figure 2:
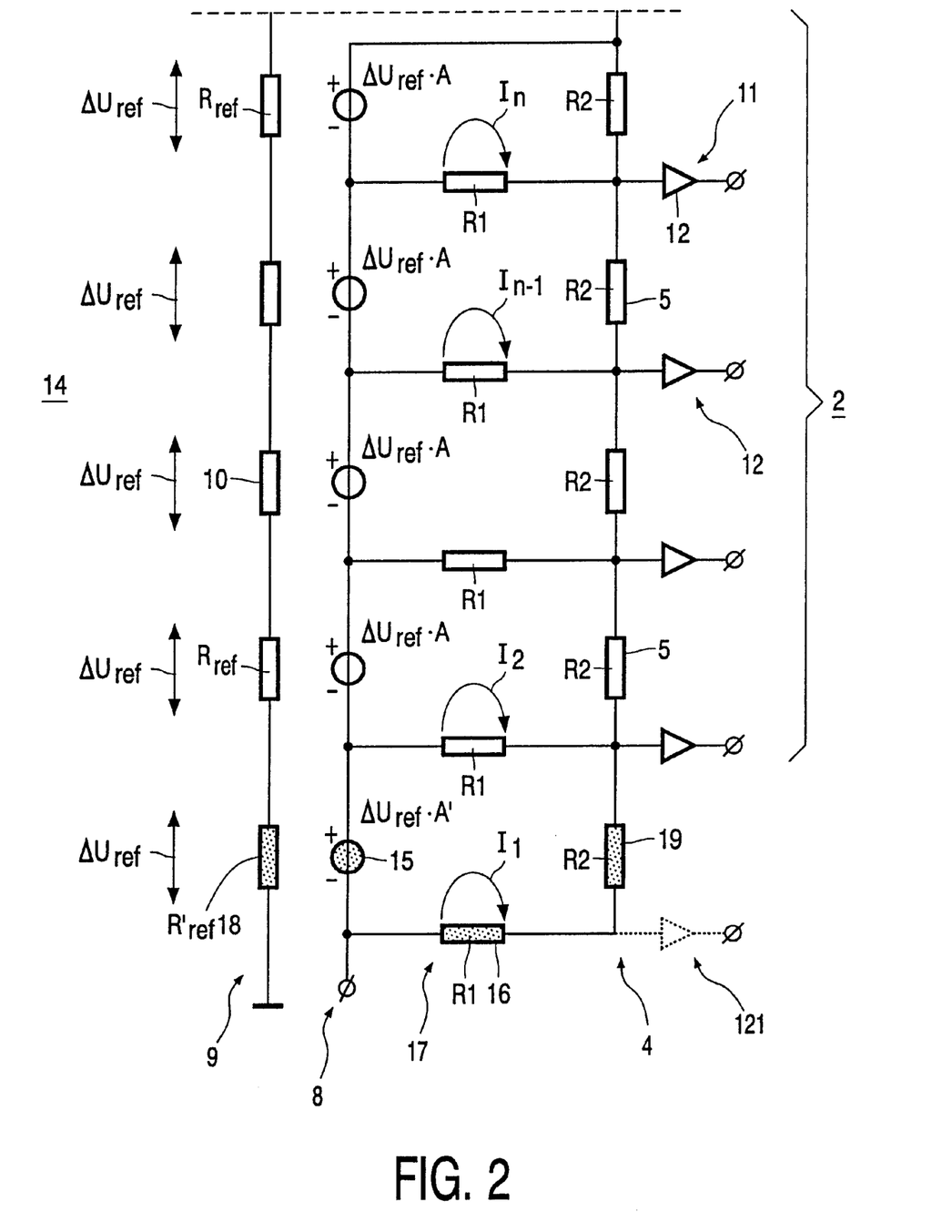
FIG. 2 shows a small-signal equivalent circuit of an AD-converter according to the invention.

In contrast, in FIG. 2 is illustrated a small-signal equivalent circuit of an array 14 according to the invention, having a general identical design as the array in FIG. 1, that is, comprising amplifying circuits 2 of generally uniform amplifying and impedance characteristics, and further comprising an input voltage network 8, a reference voltage network 9, an averaging network 4, and an output voltage network 11 for outputting amplified voltage differences from each of said plurality of amplifying circuits 2. In the small-signal approximation, the amplifiers are modeled as a voltage source 15 and an output impedance 16. The array 14 according to the invention comprises a modified outer amplifying circuit or termination circuit 17, that is, a circuit deviantly dimensioned from the amplifying circuits 2 inside the array 1. This is illustrated in FIG. 2 by the dotted electronic components constituting said termination circuit 17, specifically, a termination amplifying circuit 17 having deviant amplifying and/or impedance characteristics; a deviant reference impedance 18, and/or a deviant termination averaging impedance 19. By designing a termination circuit according to the invention, an electric current in the output voltage terminal of the outer amplifying circuits of the array is corrected for the finite size of the array 14. Specifically, according to the invention, the amplifying and/or impedance characteristics of said termination circuit 17 and/or the termination reference voltage 18, and/or the termination averaging impedance 19 of said termination network deviate so that currents through each averaging impedance 5, 19 between adjacent output voltage terminals of said array 14 are generally equal in magnitude.

A sub circuit analysis for an amplifying circuit n in the center of the array 1 yields the following equation (see FIG. 2):

$$\Delta U_{ref} \cdot A_u = R_1(I_n - I_{n+1}) + R_2 I_n + R_1(I_n - I_{n-1}) \quad (1)$$

In this equation $\Delta U_{ref}$ represents a potential difference between subsequent reference voltage taps, $A_u$ represents the amplification of the amplifying circuit, $R_1$ represents an generally identical output impedance of said amplifying circuits and $R_2$ represents a generally identical averaging impedance between the output terminals of said amplifying circuits. The subcircuit currents of circuits n−1, n and n+1 are represented by $I_{n+1}$, $I_n$ and $I_{n+1}$ respectively.

In case the circuit approximates an infinite long string of amplifiers and resistors in both directions, the current of each subcircuit equals the current of both neighboring subcircuits:

$$I_{n-1} \approx I_n \approx I_{n+1} (n=1, 2, \ldots) \quad (2)$$

From this equation, it follows that the current through $R_2$ (in FIG. 2: reference numeral 5) equals:

$$I_{R2} = I_n \approx \frac{\Delta U \cdot A_u}{R_2} \quad (3)$$

However, for an amplifying circuit 17 located at the outer ends of the array 14, the equation reads:

$$\Delta U_{ref} \cdot A_u = R_1(I_1 - I_2) + R'_2 I_1 + R'_1 I_1 \quad (4)$$

In equation (4) values $R'_2$, $R'_1$ represent the averaging impedance and output impedance of the outer amplifying circuit 17. From this equation (4), it follows that the current through $R'_2$ equals:

$$I_1 = \frac{\Delta U_{ref} \cdot A_u + I_2 R_1}{R_1 + R'_1 + R'_2} \quad (5)$$

Hence, it follows from equation (5) that by modifying the amplifying characteristics (expressed as $\Delta U_{ref} \cdot A_u$), and/or the impedances $R'_2$ (19) and $R'_1$ (16), the current $I_1$ can be modified by deviating the amplifying and/or impedance characteristics, termination reference voltage, and/or the termination averaging impedance 19 to generate a current in said output voltage terminal of said outer amplifying circuit 17 of said array 14 to be equal to the current $I_2$ ($I_n$) flowing through the rest of the amplifying circuits 2, thereby correcting for the finite size of the array 14.

It is noted that by a suitable modification of aforementioned electronic components, the averaging resistor $R'_2$ (19) may be left unaltered and generally equal to the other averaging resistors $R_2$. In that case an output terminal 121 may be coupled to the outer amplifying circuit 17, since not only the current in said circuit 17 remains generally equal to the currents $I_2$ ($I_n$) flowing through the rest of the amplifying circuits 2, but also the voltage difference over the averaging resistor $R'_2$ is generally equal to the differences of the averaging resistors $R_2$ of the rest of the amplifying circuits 2. This modification has as a special advantage that no dummy circuit whatsoever needs to be active in order to restore linearity properties.

Figure 3:
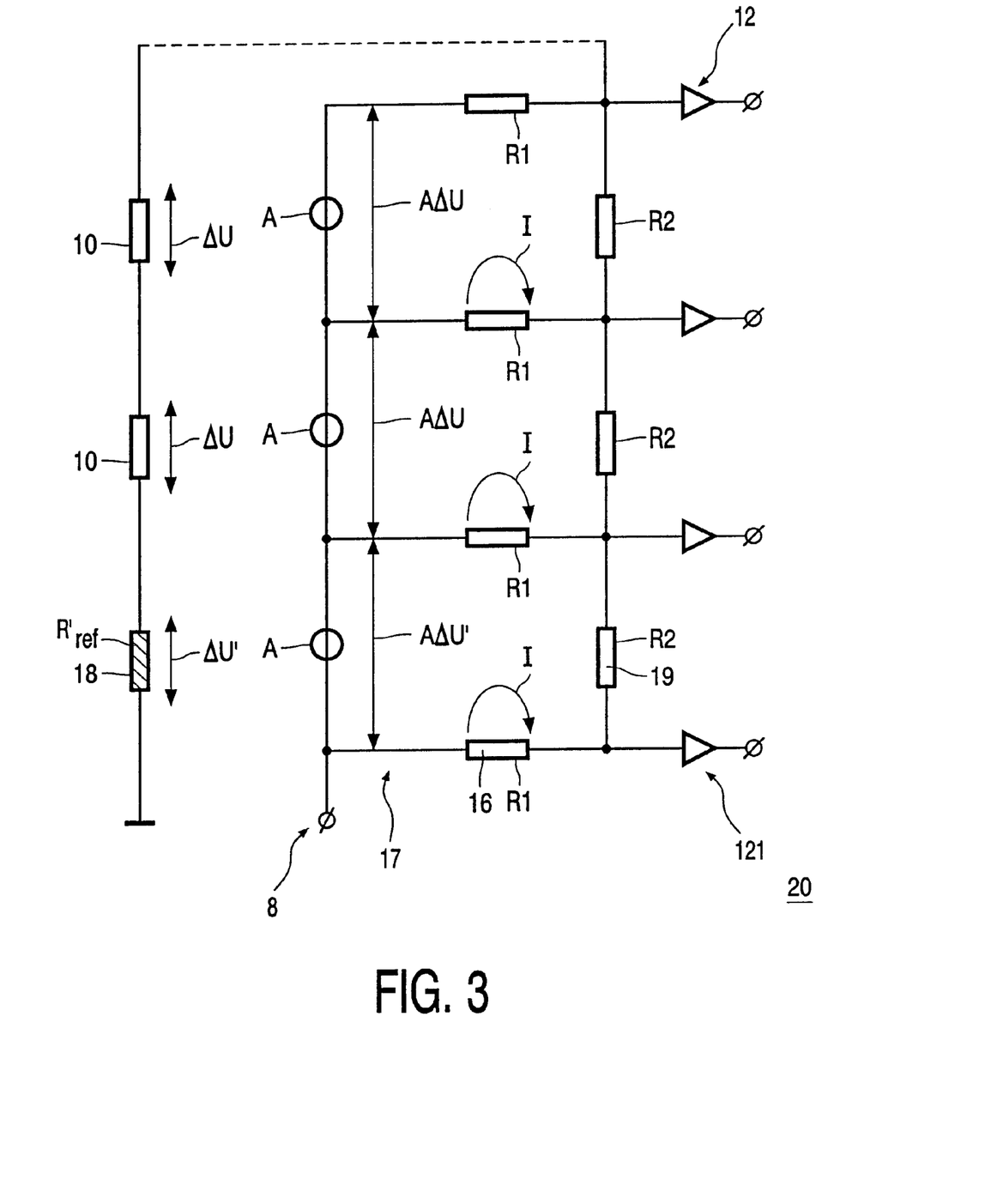
FIG. 3 shows a first embodiment of an AD-converter according to the invention.

As a first embodiment, FIG. 3 shows an example of an AD-converter 20 according to the invention wherein a voltage difference over an outer termination reference resistor 18 is larger than compared to the reference voltages over the other reference resistors 10. The output impedance 16 of circuit 17 and the averaging impedance 19 are not deviant, and are therefore equal to $R_1$, $R_2$, respectively. An output terminal 121 is coupled to the circuit 17. The amplifying characteristics denoted in the equations (1–5) by $A_u$ of said outer circuit 17 are also unchanged with respect to the amplifying characteristics of inner circuits 2. Specifically equation (4) now reads, for the termination circuit 17:

$$\Delta U'_{ref} \cdot A_u = R_1(I_1 - I_2) + R_2 I_1 + R_1 I_1 \quad (6)$$

Linearity is restored when $I_1 = I_2$ and $I_2 R_2 = \Delta U_{ref} \cdot A_u$. It follows that:

$$\Delta U'_{ref} = \frac{R_1 + R_2}{R_2} \cdot \Delta U_{ref} \quad (7)$$

Figure 4:
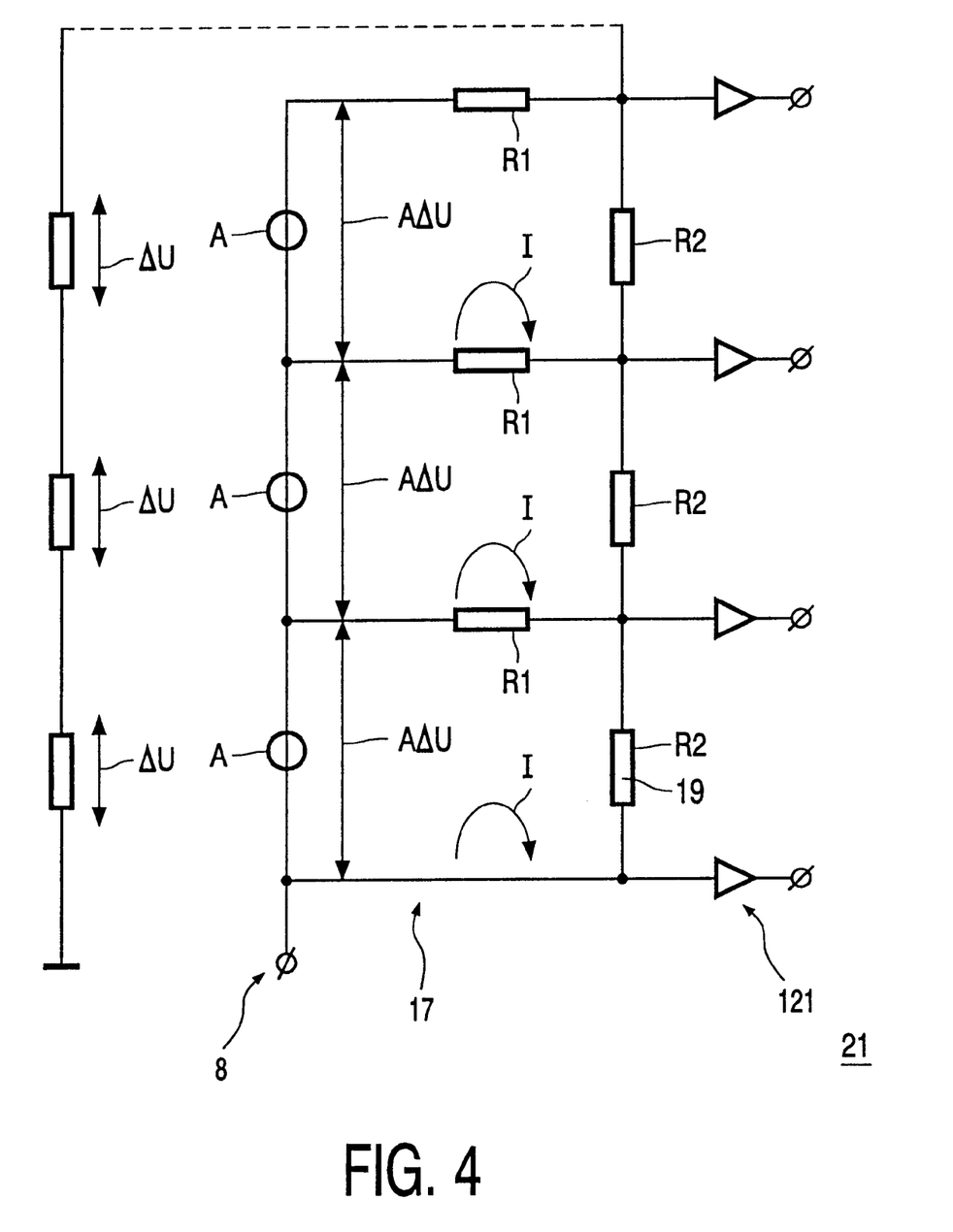
FIG. 4 shows a second embodiment of an AD-converter according to the invention.
Figure 5:
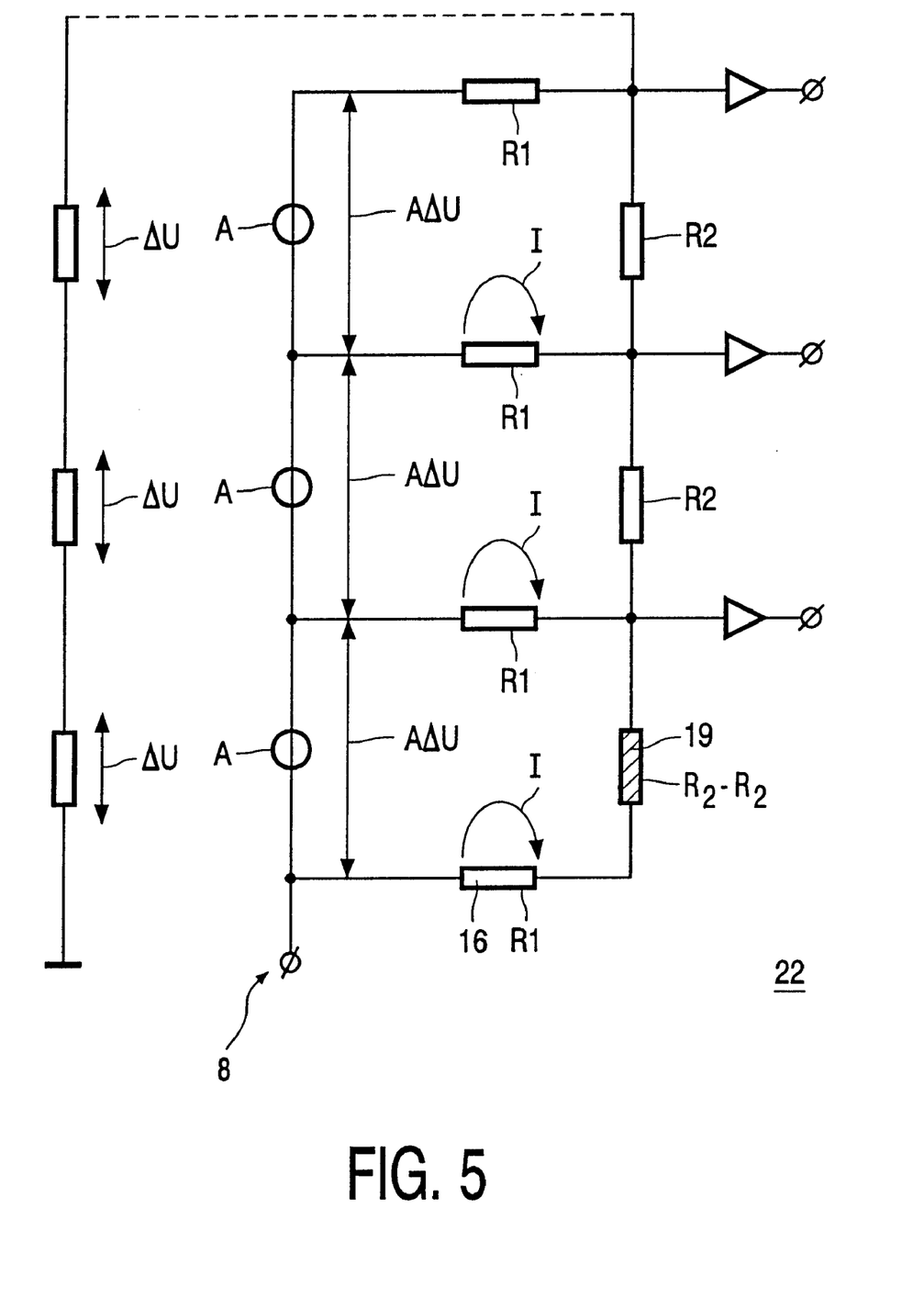
FIG. 5 shows a third embodiment of an AD-converter according to the invention.

A further embodiment is shown in FIGS. 4 and 5. Herein, starting from equation (4), and setting $I_1 = I_2$ and $\Delta U_{ref} \cdot A_u = R_2 I_2$ yields:

$$R'_1 + R'_2 = R_2 \quad (7)$$

It follows that equation (7) is a condition for an outer termination circuit 17 to have a same sub circuit current as inner circuits 2.

In FIG. 4, an AD-converter 21 according to a second embodiment of the invention is illustrated, with a modified termination circuit 17, wherein equation (7) is satisfied by having $R'_1$ equal to zero; and $R'_2 = R_2$. This condition enables an output terminal 121 to be coupled to the circuit 17. Hence, by requiring that the outer termination circuit 17 has a zero output impedance, and further having the amplifying characteristics of said termination circuit 17, the termination reference voltage and the termination averaging impedance 19 unmodified with respect to the inner circuits 2, the array 21 exhibits the improved linearity properties according to the invention.

In FIG. 5, still another embodiment of the invention is shown. In array 22, the amplifying and impedance characteristics of the termination circuit 17 and the termination reference voltage are relatively unchanged with respect to the amplifying circuits 2. However, the averaging impedance 19 now equals $R_2-R_1$, assuming $R_2>R_1$.

Figure 6:
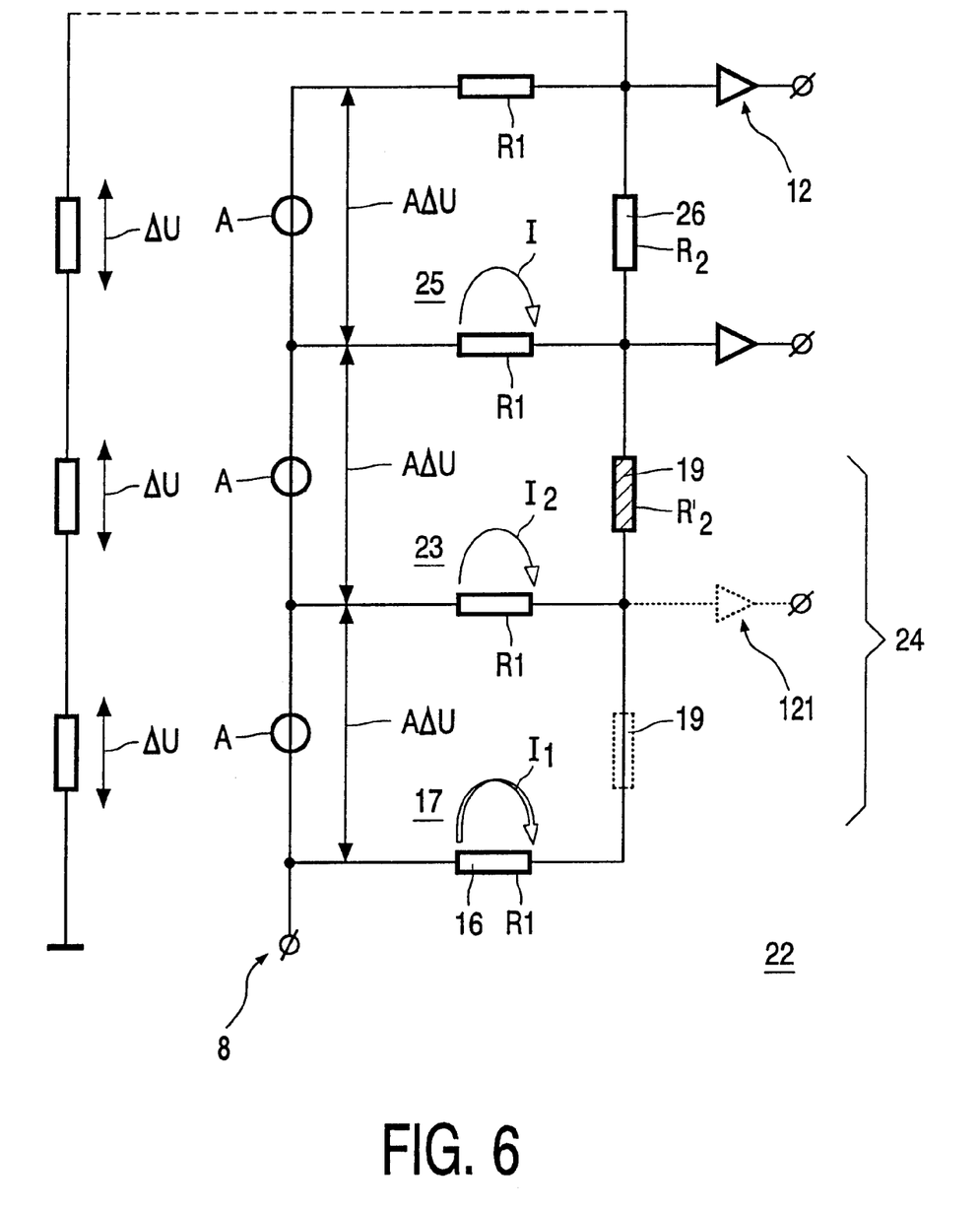
FIG. 6 shows a fourth embodiment of an AD-converter according to the invention.

FIG. 6 shows an embodiment of the invention wherein the output impedance 16 $R_1$ is larger than the averaging impedance $R_2$, hence, $R_2-R_1<0$.

The solution proposed in FIG. 5 is not valid for this case, since the modified termination averaging resistor 19 cannot have a negative value. However, the solution proposed in FIG. 6 resolves this by setting the averaging resistor 19 to zero, that is, short-circuiting the output voltage terminals of two outer circuits 17, 23 that are adjacent. Thus, a termination network 24 having the output voltage terminals 3 of termination circuits 17, 23 short-circuited, yields the following sub circuit equations for termination circuits 17 and 23 (denoted with subscripts 1 and 2 respectively):

17: $\Delta U_{ref} \cdot A_u = R_1(I_1-I_2)+R_1 I_1$  (8)

23: $\Delta U_{ref} \cdot A_u = R_1(I_2-I_n)+R'_2 I_2+R_1(I_2-I_1)$

Linearity requires that $I_2-I_n=0$ and $\Delta Uref \cdot Au = R_2 I_2$; solving for $R'_2$ yields a termination impedance equaling $$\frac{3}{2}R_2 - \frac{1}{2}R_1,$$

wherein the amplifying and impedance characteristics of said termination circuit and the termination reference voltages are not deviant.

It is shown, that in this way, the required negative termination resistor is provided by an extra amplifier. If the value for the required termination averaging resistor $R'_2$, having a value of $$\frac{3}{2}R_2 - \frac{1}{2}R_1,$$

still yields a negative outcome, the method of short-circuiting can be repeated, hence, if said magnitude is negative, output voltage terminal of said termination circuit 23 is short-circuited output voltage terminal 3 of next adjacent circuit 25 (equivalent to setting $R'_2$ to zero); and calculating a magnitude of a next termination impedance 26 coupling a next output voltage terminal of said termination circuit 26 to a next output voltage terminal of an amplifying circuit adjacent to said termination circuit 25. Depending on the actual value of $R'_2$ (i.e. if $R'_2$ equals $R_2$), an output terminal 121 may be coupled to the circuit 17 (in the drawing shown as optional by dashed lines).

It will be clear to those skilled in the art that the invention is not limited to the embodiments described with reference to the drawing but may comprise all kinds of variations thereof. These and other variations are deemed to fall within the scope of protection of the appended claims.

What is claimed is:

1. An AD-converter, comprising:
    a plurality of amplifying circuits having generally uniform amplifying and impedance characteristics, each circuit comprising:
        an input voltage terminal;
        a reference voltage terminal; and
        an output voltage terminal;
    an input voltage network applying an analog input voltage to each input voltage terminal of said amplifying circuits;
    a reference voltage network applying reference voltages of a generally uniformly spacing to each reference voltage terminal of said amplifying circuits, wherein a relative functional position of each amplifying circuit is determined by the magnitude of a received reference voltage;
    an averaging network, comprising of generally identical averaging impedances coupling output voltage terminals of adjacent amplifying circuits;
    an output voltage network for outputting amplified voltage differences from each of said plurality of amplifying circuits; and
    a termination network comprising a termination circuit and a termination averaging impedance, said termination circuit receiving an input voltage and a termination reference voltage and comprising an output voltage terminal that is coupled by said termination averaging impedance to an output voltage terminal of an outer amplifying circuit of said array, characterized in that
    the amplifying and/or impedance characteristics of said termination circuit and/or the termination reference voltage, and/or the termination averaging impedance are deviant to generate a current in said output voltage terminal of said outer amplifying circuit of said array, that is corrected for the finite size of the array.

2. AD-converter according to claim 1, characterized in that in an array comprising amplifier circuits having an output impedance of R1 and coupled by averaging impedances having a value of R2, wherein R1>R2 the termination averaging impedance is created by an active circuit, wherein the amplifying and impedance characteristics of said termination circuit and the termination reference voltage are not deviant.

3. AD-converter according to claim 2, characterized in that the termination network comprises a plurality of termination circuits, wherein at least two output voltage terminals of two adjacent termination circuits are short-circuited.

4. AD-converter according to claim 3, characterized in that the termination network comprises two termination circuits comprising output voltage terminals which are short circuited, the amplifying circuits further receiving an equally spaced referenced voltage and being connected to the input voltage, wherein the output voltage terminals of said amplifying circuits are coupled by a termination averaging impedance to an output voltage terminal of an outer amplifying circuit of said array, the termination averaging impedance equaling $$\frac{3}{2}R_2 - \frac{1}{2}R_1,$$

wherein the amplifying and impedance characteristics of said termination circuit and the termination reference voltages are not deviant.

5. AD-converter according to claim 1, characterized in that a voltage difference between said termination reference voltage and a reference voltage received by an outer amplifying circuit is larger as compared to the generally uniform spacing between each reference voltage received by said amplifier circuits, wherein the amplifying and impedance characteristics of said termination circuit and the termination averaging impedance are not deviant.

6. AD-converter according to claim 5, characterized in that in an array comprising amplifier circuits having an output impedance of R1 and coupled by averaging impedances having a value of R2, the voltage difference is a factor $$\frac{R1 + R2}{R2}$$

larger compared to said uniform spacing.

7. AD-converter according to claim 1, characterized in that the amplifying and/or impedance characteristics of said termination circuit and/or the termination reference voltage, and/or the termination averaging impedance of said termination network deviate so that currents through each averaging impedance between adjacent output voltage terminals of said array are generally equal in magnitude.

8. AD-converter according to claim 1, characterized in that the termination circuit has a zero output impedance wherein the amplifying characteristics of said termination circuit, the termination reference voltage and the termination averaging impedance are not deviant.

9. AD-converter according to claim 1, characterized in that in an array comprising amplifier circuits having an output impedance of R1 and coupled by averaging impedances having a value of R2, the termination averaging impedance equals R2−R1, wherein the amplifying and impedance characteristics of said termination circuit and the termination reference voltage are not deviant.

10. Method of designing an AD-converter according to claim 1 wherein the amplifying and impedance characteristics of said termination circuit and the termination reference voltage are generally uniform in magnitude, in an array comprising amplifier circuits having an output impedance of R1 and coupled by averaging impedances having a value of R2, wherein R1>R2, the method comprising the steps of:

short-circuiting two output voltage terminals of two adjacent outer termination circuits; and the method further comprising repeating the steps of:

calculating a magnitude of a first termination impedance coupling an output voltage terminal of said termination circuit to a first output voltage terminal of an amplifying circuit adjacent to said termination circuit, so that a current through each averaging impedance between adjacent output voltage terminals of said array is generally equal in magnitude; and if said magnitude is negative, short circuiting said output voltage terminal of said termination circuit to said first output voltage terminal and calculating a magnitude of a next termination impedance coupling a next output voltage terminal of said termination circuit to a next output voltage terminal of an amplifying circuit adjacent to said termination circuit.

* * * * *